United States Patent
Minamihaba et al.

(10) Patent No.: US 7,842,191 B2
(45) Date of Patent: Nov. 30, 2010

(54) CMP SLURRY FOR METALLIC FILM, POLISHING METHOD AND METHOD OF MANUFACTURING SEMICONDUCTOR DEVICE

(75) Inventors: Gaku Minamihaba, Yokohama (JP); Dai Fukushima, Kamakura (JP); Nobuyuki Kurashima, Yokohama (JP); Susumu Yamamoto, Yokohama (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 514 days.

(21) Appl. No.: 11/340,494

(22) Filed: Jan. 27, 2006

(65) Prior Publication Data

US 2006/0243702 A1 Nov. 2, 2006

(30) Foreign Application Priority Data

Apr. 28, 2005 (JP) ............................. 2005-132095

(51) Int. Cl.
  *C09K 13/00* (2006.01)
(52) U.S. Cl. ...................... 252/79.1; 438/689; 438/690; 438/692; 438/693; 438/745; 51/298; 51/307
(58) Field of Classification Search ............... 252/79.1; 438/687, 689, 690, 692, 693, 745; 51/298, 51/307
See application file for complete search history.

(56) References Cited

U.S. PATENT DOCUMENTS

| | | | |
|---|---|---|---|
| 6,143,662 A * | 11/2000 | Rhoades et al. | 438/690 |
| 6,426,294 B1 | 7/2002 | Hirabayashi et al. | |
| 6,530,968 B2 | 3/2003 | Tsuchiya et al. | |
| 6,561,883 B1 * | 5/2003 | Kondo et al. | 451/63 |
| 7,148,189 B2 * | 12/2006 | Singh | 510/268 |
| 2001/0005009 A1 * | 6/2001 | Tsuchiya et al. | 252/79 |
| 2002/0037642 A1 * | 3/2002 | Wake et al. | 438/633 |
| 2004/0152308 A1 | 8/2004 | Minamihaba et al. | |
| 2004/0171265 A1 | 9/2004 | Ye et al. | |
| 2004/0253822 A1 * | 12/2004 | Matsui et al. | 438/690 |
| 2005/0009322 A1 * | 1/2005 | Matsui et al. | 438/633 |

(Continued)

FOREIGN PATENT DOCUMENTS

JP 2002-164308 6/2002

(Continued)

OTHER PUBLICATIONS

Notification of First Office Action from Chinese Patent Office in Application No. 2006/0076096.5, dated Jun. 13, 2008.

(Continued)

*Primary Examiner*—Lan Vinh
*Assistant Examiner*—Maki A Angadi
(74) *Attorney, Agent, or Firm*—Finnegan, Henderson, Farabow, Garrett & Dunner, L.L.P.

(57) ABSTRACT

A CMP slurry for metallic film is provided, which includes water, 0.01 to 0.3 wt %, based on a total quantity of the slurry, of polyvinylpyrrolidone having a weight average molecular weight of not less than 20,000, an oxidizing agent, a protective film-forming agent containing a first complexing agent for forming a water-insoluble complex and a second complexing agent for forming a water-soluble complex, and colloidal silica having a primary particle diameter ranging from 5 to 50 nm.

11 Claims, 3 Drawing Sheets

U.S. PATENT DOCUMENTS

| | | |
|---|---|---|
| 2005/0090104 A1 | 4/2005 | Yang et al. |
| 2005/0136670 A1 | 6/2005 | Ameen et al. |
| 2006/0037251 A1 | 2/2006 | Kurata et al. |
| 2006/0135045 A1 | 6/2006 | Bian et al. |
| 2006/0243702 A1 | 11/2006 | Minamihaba et al. |
| 2007/0051917 A1 | 3/2007 | Thomas et al. |
| 2007/0082456 A1 | 4/2007 | Uotani et al. |

FOREIGN PATENT DOCUMENTS

| | | |
|---|---|---|
| JP | 2002-270549 | 9/2002 |
| JP | 2003-282494 | 10/2003 |
| JP | 2004-152785 | 5/2004 |
| JP | 2005-045229 | 2/2005 |
| WO | WO 99/64527 | 12/1999 |
| WO | WO/03/103033 A1 | 12/2003 |

OTHER PUBLICATIONS

Notice of Reasons for Rejection mailed Aug. 31, 2010, in corresponding Japanese Patent Application No. 2005-132095 and English-language translation thereof.

* cited by examiner

CMP SLURRY FOR METALLIC FILM, POLISHING METHOD AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2005-132095, filed Apr. 28, 2005, the entire contents of which are incorporated herein by reference.

BACKGROUND OF THE INVENTION

1. Field of the Invention

This invention relates to a slurry for chemical mechanical polishing (CMP), a polishing method, and a method of manufacturing a semiconductor device. In particular, this invention relates to a CMP slurry for metallic film, a polishing method of a metallic film, and a method for manufacturing a semiconductor device using a damascene wiring.

2. Description of the Related Art

A Cu damascene wiring to be mounted on a high-performance LSI has been formed by using CMP. In this CMP, the polishing is performed in two steps, i.e., a first polishing where the abrasion of Cu is mainly performed, and a second polishing where the abrasion of redundant metal and insulating film is performed. In the first polishing, Cu is abraded at a rate of 800 nm/min or more while substantially preventing a barrier metal such as Ta and Ti from being abraded. It is demanded, in this first polishing, to suppress the dishing of Cu to 20 nm or less. When a Low-k material is to be employed as an insulating film, the peeling of film or the fracture of film itself would occur if the polishing friction is large. Therefore, it is now becoming difficult to employ the conventional CMP slurry which is inherently large in polishing friction.

In the case of the second polishing also, it is desired, as in the case of the first polishing, to perform the polishing at low friction so as to enhance the affinity between a polishing surface and a polishing pad and to minimize the scratch of Cu, the corrosion of Cu and the scratch of insulating film, thereby suppressing the dishing of Cu as well as the erosion of insulating film. Since the conventional silicone-based surfactant acts strongly on silica employed an abrasive particle to generate coarse particles thereof, it is difficult to suppress the generation of scratch of Cu or the insulating film and to stabilize the polishing rate.

With a view to meet the requirements in the aforementioned first polishing and second polishing, there has been proposed to employ a slurry where polyvinylpyrrolidone (PVP) is used. However, no one has succeeded to obtain a slurry which is excellent in stability and, at the same time, capable of suppressing the dishing or corrosion of Cu and the scratch of insulating film in the formation of Cu damascene wiring. Therefore, there is no slurry at present which is capable of sufficiently meeting the performances demanded of the LSI of the next generation.

BRIEF SUMMARY OF THE INVENTION

A CMP slurry for metallic film according to one aspect of the present invention comprises water; 0.01 to 0.3 wt %, based on a total quantity of the slurry, of polyvinylpyrrolidone having a weight average molecular weight of 20,000 or more; an oxidizing agent; a protective film-forming agent containing a first complexing agent for forming a water-insoluble complex and a second complexing agent for forming a water-soluble complex; and colloidal silica having a primary particle diameter ranging from 5 to 50 nm.

A polishing method according to another aspect of the present invention comprises contacting a semiconductor substrate having a metallic film with a polishing pad attached to a turntable; and supplying a metallic film-CMP slurry onto the polishing pad to polish the metallic film, the metallic film-CMP slurry comprising water; 0.01 to 0.3 wt %, based on a total quantity of the slurry, of polyvinylpyrrolidone having a weight average molecular weight of not less than 20,000; an oxidizing agent; a protective film-forming agent containing a first complexing agent for forming a water-insoluble complex and a second complexing agent for forming a water-soluble complex; and colloidal silica having a primary particle diameter ranging from 5 to 50 nm.

A method for manufacturing a semiconductor device according to another aspect of the present invention comprises forming an insulating film above a semiconductor substrate; forming a recess in the insulating film; depositing a metal inside the recess as well as above the insulating film to form a metallic film; and removing at least part of the metal which is deposited above the insulating film by CMP using a metallic film-CMP slurry, the metallic film-CMP slurry comprising water; 0.01 to 0.3 wt %, based on a total quantity of the slurry, of polyvinylpyrrolidone having a weight average molecular weight of not less than 20,000; an oxidizing agent; a protective film-forming agent containing a first complexing agent for forming a water-insoluble complex and a second complexing agent for forming a water-soluble complex; and colloidal silica having a primary particle diameter ranging from 5 to 50 nm.

DETAILED DESCRIPTION OF THE INVENTION

Figure 1:
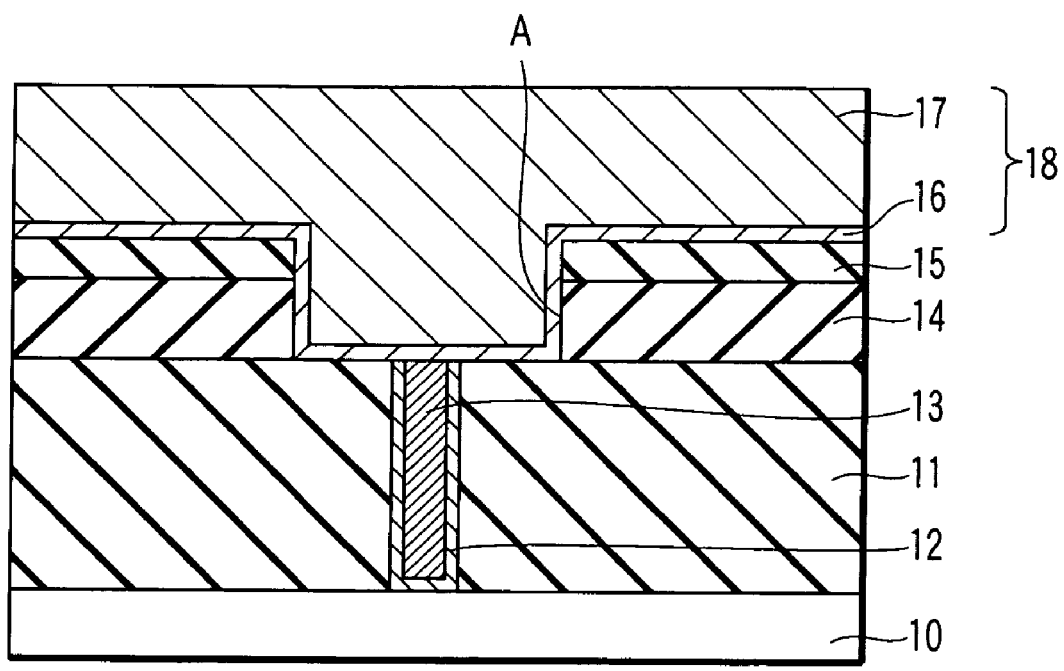
FIG. 1 is a cross-sectional view illustrating one step in the method of manufacturing a semiconductor device according to one embodiment of the present invention.

Next, embodiments of the present invention will be explained.

The CMP slurry for metallic film according to one embodiment of the present invention contains polyvinylpyrrolidone (PVP) having a weight average molecular weight of 20,000 or more. The weight average molecular weight of PVP can be measured by aqueous gel permeation chromatography (GPC) for example. The PVP having a weight average molecular weight of less than 20,000 is incapable of reducing polishing friction, thereby making it difficult to suppress the dishing of metallic film or the corrosion of metallic film. Further, it is difficult to secure the stability of polishing. As long as it is possible to maintain the viscosity of the slurry to less than 2 mPa·sec as described hereinafter, there is not any particular limitation with respect to the upper limit of the weight average molecular weight of PVP. However, if the weight average molecular weight of PVP is increased, it tends to become difficult to obtain a practical polishing rate of metallic film. Under some circumstances, the PVP which is excessively large in weight average molecular weight may bring about the aggregation of colloidal silica inside a slurry-feeding apparatus, resulting in the generation of scratch of Cu due to this aggregated silica. In view of these facts, it is desirable to determine the upper limit of the weight average molecular weight of PVP.

The viscosity of the slurry can be approximately determined based on the average molecular weight and content of the PVP. The content of the PVP in the CMP slurry for metallic film according to one embodiment of the present invention is confined to the range of 0.01 to 0.3 wt % based on a total quantity of the CMP slurry. If the content of the PVP is less than 0.01 wt %, it would be impossible to secure the effect of reducing the polishing friction, thus resulting in an increase in the temperature of the polishing pad. As a result, a phenomenon of stopping the polishing (CMP stop) would be more likely to occur. Additionally, the Cu-removing action of slurry at an over-plating portion of Cu would be deteriorated. On the other hand, if the content of the PVP exceeds higher than 0.3 wt %, it may become difficult to suppress the corrosion of Cu. Furthermore, the viscosity of the slurry may become higher than 2 mPa·sec, thus making it difficult to feed the slurry to the polishing pad in a stable manner. In that case, an increase in temperature of the polishing pad or non-uniformity of polishing (deterioration of in-plane uniformity) may occur, thus causing the Cu polishing rate or the dishing of Cu to become non-uniform. Incidentally, in the case of the slurry to be employed in the first polishing where a wiring metal such as Cu is abraded while leaving a barrier metal to remain, the content of the PVP should preferably be confined within the range of 0.03 to 0.3 wt % based on a total quantity of the slurry. Further, in the case of the slurry to be employed in the second polishing where the barrier metal is abraded to expose an insulating film, the content of the PVP should preferably be confined within the range of 0.01 to 0.1 wt % based on a total quantity of the slurry.

In particular, it is preferable that PVP having a weight average molecular weight of 40,000 or more is incorporated in the slurry at a ratio of 0.01 to 0.1 wt % based on a total quantity of the slurry. In this case, it is possible to achieve low friction, high polishing rate and low barrier metal-polishing rate in the first polishing. Additionally, the dishing of Cu and the erosion of insulating film can be suppressed, thus making it possible to minimize the defects such as the corrosion and scratch of Cu. Furthermore, the Cu polishing action at an over-plating portion of Cu can be enhanced, thus making it possible to enhance the stability of polishing and the uniformity of polishing rate. In the second polishing also, it is possible to achieve the low friction and to suppress the dishing of Cu and the erosion of insulating film. Additionally, the defects such as the corrosion and scratch of Cu can be minimized, thus making it possible to enhance the stability of polishing and the uniformity of polishing rate.

As long as the conditions as described above with regard of the weight average molecular weight and content of the PVP are fulfilled, two or more kinds of PVP differing in weight average molecular weight from each other may be incorporated in the CMP slurry for metallic film according to one embodiment of the present invention.

As for the oxidizing agent, it is possible to employ at least one selected from the group consisting of ammonium persulfate, potassium persulfate, hydrogen peroxide, ferric nitrate, diammonium cerium nitrate, iron sulfate, ozone and potassium periodate. In view of the oxidizing action, the compatibility with the protective film and the easiness for handling, it is preferable to employ ammonium persulfate, potassium persulfate and hydrogen peroxide. The content of the oxidizing agent should preferably be confined within the range of 0.05 to 5 wt % based on a total quantity of the CMP slurry. If the content of the oxidizing agent is less than 0.05 wt %, it may become difficult to secure a sufficient polishing rate. On the other hand, if the content of the oxidizing agent exceeds 5 wt %, the corrosion and dishing of a metallic film such as a Cu film may be excessively increased. More preferably, the content of the oxidizing agent should be confined to the range of 0.08 to 3 wt % based on a total quantity of the CMP slurry.

The protective film-forming agent is constituted by a first complexing agent for forming a water-insoluble complex, and a second complexing agent for forming a water-soluble complex. Incidentally, the term of "water-insoluble" means that a material is substantially insoluble in water, so that if the wet etching rate under the condition where the complexing agent is co-existed with an oxidizing agent is confined to less than 3 nm/min, a material which is hardly soluble in water would be included in the definition of "water-insoluble". On the other hand, "water-soluble" means that the wet etching rate is not less than 3 nm/min. The content of the protective film-forming agent should preferably be confined to the range of 0.001 to 3.0 wt % based on a total quantity of the CMP slurry. If the content of the protective film-forming agent is less than 0.001 wt %, it may become difficult to suppress the dishing of Cu to 20 nm or less. On the other hand, if the content of the protective film-forming agent exceeds 3.0 wt %, the polishing rate may be decreased. More preferably, the content of the protective film-forming agent should be confined to the range of 0.05 to 2.0 wt % based on a total quantity of the CMP slurry.

As for the first complexing agent for forming a complex which is water-soluble or hardly soluble in water together with a metal such as Cu, it is possible to employ a heterocyclic compound comprising a complex six-membered or five-membered ring containing at least one N atom. More specifically, it is possible to employ quinaldinic acid, quinolinic acid, benzotriazole, benzoimidazole, 7-hydroxy-5-methyl-1,3,4-triazaindolizine, nicotinic acid and picolinic acid.

Further, among anionic surfactants, some of them are useful as the first complexing agent. For example, it is possible to employ alkylbenzene sulfonate such as potassium dodecylbenzene sulfonate and ammonium dodecylbenzene sulfonate.

The content of the first complexing agent should preferably be confined to the range of 0.0005 to 2.0 wt % based on a total quantity of the CMP slurry. If the content of the first complexing agent is less than 0.0005 wt %, the dishing of Cu may be excessively increased. On the other hand, if the content of the first complexing agent exceeds 2.0 wt %, it would be impossible to secure a sufficiently high Cu-polishing rate. More preferably, the content of the first complexing agent should be confined to the range of 0.0075 to 1.5 wt % based on a total quantity of the CMP slurry.

On the other hand, the second complexing agent for forming a water-soluble complex fulfills the role of polishing-accelerating agent. Examples of the second complexing agent include amino acid such as glycine, alanine and tryptophan. Further, an organic acid which capable of exhibiting the same effect as the polishing-accelerating agent can be also employed. Examples of such an organic acid include formic acid, lactic acid, acetic acid, tartaric acid, fumaric acid, glycol acid, phthalic acid, maleic acid, oxalic acid, citric acid, malic acid, malonic acid, glutamic acid, etc. It is also possible to employ basic salts such as ammonia, ethylene diamine, tetramethyl ammonium hydroxide (TMAH), etc.

The content of the second complexing agent should preferably be confined to the range of 0.0005 to 2.0 wt % based on a total quantity of the CMP slurry. If the content of the second complexing agent is less than 0.0005 wt %, it may not be possible to polish Cu at a sufficiently high polishing rate. On the other hand, if the content of the second complexing agent exceeds 2.0 wt %, the dishing of Cu as well as the corrosion of Cu may occur excessively. More preferably, the content of the second complexing agent should be confined to the range of 0.0075 to 1.5 wt % based on a total quantity of the CMP slurry.

The first and the second complexing agents may be employed singly or in combination of two or more kinds thereof.

In this embodiment of the present invention, the primary particle diameter of the colloidal silica is confined within the range of 5 to 50 nm. If the primary particle diameter of the colloidal silica is less than 5 nm, the abrading action would become non-uniform, thus making it difficult to uniformly abrade various patterns. Additionally, since the dispersion stability of colloidal silica deteriorates, rendering continued use thereof difficult. On the other hand, if the primary particle diameter of the colloidal silica exceeds 50 nm, it would become difficult to control the surface roughness Ra of polishing surface to 3 nm or less and would lead to increase of dishing or scratch. As long as the Ra of polishing surface is confined to 3 nm or less, it would be acceptable, which can be confirmed by atomic force microscopy (AFM).

As for the colloidal silica having a primary particle diameter ranging from 5 to 50 nm, it is possible to employ colloidal silica having a primary particle diameter of 5 nm or more and an association degree of 5 or less. By the expression of "association degree", it means a value which can be obtained by dividing the diameter of secondary particle consisting of an aggregate of primary particles by the diameter of primary particle (diameter of secondary particle/diameter of primary particle). Herein, a value of 1 in association degree means that the system is consisted of only monodispersed primary particles. The diameter of secondary particle can be measured by dynamic light scattering method, laser diffraction method or electron microscopic method. When the association degree of particles exceeds 5, the scratch or erosion may generate on the polishing surface in the step of polishing using a slurry containing the colloidal silica of such a association degree as a polishing particle.

A first colloidal silica having a primary particle diameter ($d_1$) ranging from 5 to 20 nm ($5 \leq d_1 \leq 20$) may be combined with a second colloidal silica having a primary particle diameter ($d_2$) ranging from more than 20 to 50 nm ($20 < d_2 \leq 50$) so as make it possible to use them as colloidal silica having a primary particle diameter ranging from 5 to 50 nm. In this case, the weight ratio of the first colloidal silica in a total of the first colloidal silica and the second colloidal silica should preferably be confined to 0.6 to 0.9. If the weight ratio of the first colloidal silica is less than 0.6, the resultant colloidal silica may exhibit the CMP characteristics of only the second colloidal silica. As a result, the Ra of polishing surface may exceed 3 nm, resulting in the finishing of roughened surface. Additionally, it becomes also difficult to suppress the dishing to 20 nm or less. On the other hand, if the weight ratio of the first colloidal silica exceed 0.9, the resultant colloidal silica may exhibit the CMP characteristics of only the first colloidal silica, resulting in deterioration of polishing action.

The content of the colloidal silica should preferably be confined to the range of 0.05 to 10 wt %, more preferably 0.1 to 5 wt % based on a total quantity of the CMP slurry. If the content of the colloidal silica is less than 0.05 wt %, it may not be possible to secure a sufficiently high polishing action. On the other hand, if the content of the colloidal silica exceeds 10 wt %, the scratch or dishing of Cu may increase.

In addition to the aforementioned colloidal silica, an organic particle may be incorporated in the slurry. As for the organic particle, it is possible to employ polymethyl methacrylate (PMMA), polystyrene, etc. The organic particle may be integrated with the aforementioned colloidal silica to form a complex particle.

The CMP slurry for metallic film according to one embodiment of the present invention may include, as required, a surfactant. As for the surfactant, it is preferable to use non-ionic surfactant having an average molecular weight which is smaller than that of PVP. When a high-molecular compound other than PVP is included in the slurry, various inconveniences may occur. For example, the polishing rate may be greatly deteriorated or the dishing of polishing surface may be greatly increased. As for the surfactant useful in this case, it is possible to employ a nonionic surfactant having a triple bond, examples thereof including acetylene glycol, ethylene oxide adducts of acetylene glycol, acetylene alcohol, etc. It is also possible to employ silicone-based surfactant, polyvinyl alcohol, cyclodextrin, polyvinyl methylether, hydroxyethyl cellulose, etc. Further, anionic surfactant or cationic surfactant may be incorporated. As for the anionic surfactant, it is possible to employ, for example, aliphatic soap, sulfate ester, phosphate ester, etc. As for the cationic surfactant, it is possible to employ, for example, fatty amine salt, aliphatic ammonium salt, etc. The surfactants mentioned above may be employed singly or in combination of two or more kinds.

The content of the surfactant should preferably be confined to the range of 0.001 to 0.5 wt % based on a total quantity of the CMP slurry. If the content of the surfactant falls outside this range, it may become difficult to sufficiently suppress the dishing of Cu. More preferably, the content of the surfactant should be confined to the range of 0.05 to 0.3 wt % based on a total quantity of the CMP slurry.

As for the pH of the slurry according to one embodiment of the present invention, there is not any particular limitation so that it can be adjusted depending on specific application. For example, a pH adjusting agent such as potassium hydroxide may be added to the slurry so as to adjust the alkalinity.

Embodiment 1

Next, this embodiment will be explained with reference to FIGS. 1 and 2.

Figure 2:
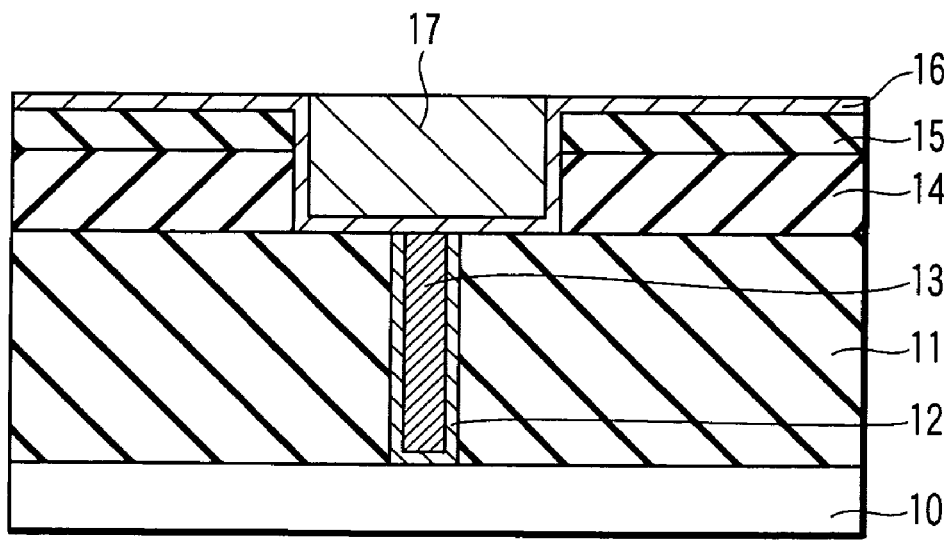
FIG. 2 is a cross-sectional view illustrating the next step following the step shown in FIG. 1.

First of all, as shown in FIG. 1, an insulating film 11 of $SiO_2$ was formed on a semiconductor substrate 10 having a semiconductor element (not shown) formed thereon and a plug 13 was formed with a barrier metal 12 being interposed between the insulating film 11 and the plug 13. The barrier metal 12 was formed using TiN and the plug 13 was formed using W as a material therefor. Then, on these insulating film 11 and plug 13, a first low dielectric constant insulating film 14 and a second low dielectric constant insulating film 15 were successively deposited to form a laminated insulating film. This first low dielectric constant insulating film 14 can be constituted by a low dielectric constant insulating material exhibiting a relative dielectric constant of less than 2.5. For example, this first low dielectric constant insulating film 11 can be formed by at least one selected from the group consisting of a film having a siloxane skeleton such as polysiloxane, hydrogen silsesquioxane, polymethyl siloxane, methyl silsesquioxane, etc.; a film containing, as a major component, an organic resin such as polyarylene ether, polybenzoxazole, polybenzocyclobutene, etc.; and a porous film such as a porous silica film, etc. Herein, the first low dielectric constant insulating film 14 was formed using LKD (available from JSR Co., Ltd.).

The second low dielectric constant insulating film 15 to be deposited on the first low dielectric constant insulating film 14 serves as a capping insulating film and can be formed by using an insulating material having a relative dielectric constant which is larger than that of the first low dielectric constant insulating film 14. For example, this second low dielectric constant insulating film 15 can be formed by employing at least one insulating material exhibiting a relative dielectric constant of 2.5 or more and selected from the group consisting, for example, of TEOS (tetraethoxy silane), SiC, SiCH, SiCN, SiOC and SiOCH. Herein, the second low dielectric constant insulating film 15 was formed using SiOC.

Then, a wiring trench A as a recess was formed so as to penetrating into the second low dielectric constant insulating film 15 and the first low dielectric constant insulating film 14. Thereafter, a Ta film 5 nm in thickness as a barrier metal 16 and a Cu film 17 having a thickness of 800 nm were successively deposited on the entire surface according to the conventional method. In this case, a metallic film 18 was constituted by the barrier metal 16 and the Cu film 17. The wiring trench "A" was formed with a fine wiring 60 nm in width and a wide wiring 75 μm in width. The density of the fine wiring was set to range from loneness to a coverage ratio of 50%, while the density of the wide wiring was set to range from loneness to a coverage ratio of 95%. Incidentally, the term of "loneness" means that only one wiring is existed in a region of 1 mm$^2$. Then, the Cu film 17 constituting part of the metallic film 18 was removed by CMP, thereby leaving the Cu film 17 buried selectively in the wiring trench "A" to expose the surface of the barrier film 16 as shown FIG. 2.

Figure 3:
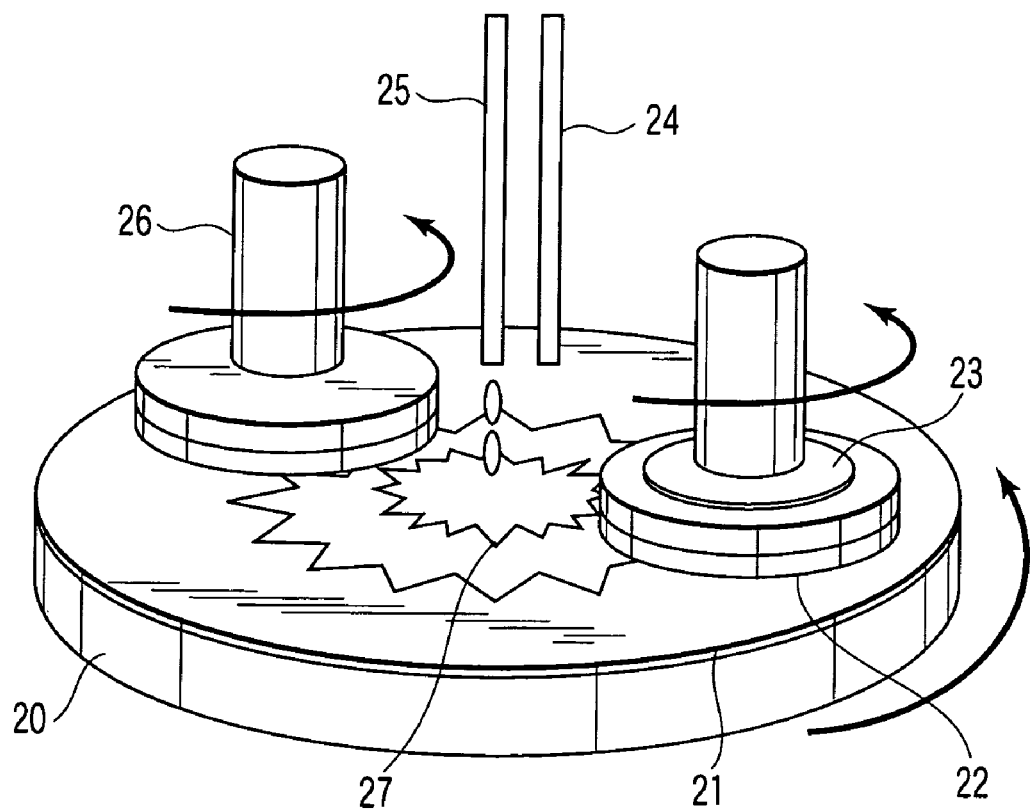
FIG. 3 is a perspective view illustrating a state of CMP.

The CMP of the Cu film 17 was performed as follows. Namely, first of all, as shown FIG. 3, while rotating a turntable 20 having a polishing pad 21 attached thereto at a speed of 100 rpm, a top ring 23 holding a semiconductor substrate 22 was allowed to contact with the turntable 20 at a polishing load of 200 gf/cm$^2$. The rotational speed of the top ring 23 was set to 105 rpm, and slurry 27 was fed onto the polishing pad 21 from a slurry supply nozzle 25 at a flow rate of 200 cc/min.

Incidentally, the polishing load of the top ring 23 can be selected from the range of 10-1,000 gf/cm$^2$, a preferable range thereof being 30-500 gf/cm$^2$. Further, the rotational speed of the turntable 20 and the top ring 23 can be optionally selected from the range of 10 to 400 rpm, a preferable range thereof being 30 to 150 rpm. The flow rate of slurry 27 from the slurry supply nozzle 25 can be selected from the range of 10-1,000 cc/min, a preferable range thereof being 50-400 cc/min.

In this polishing, various kinds of slurries as explained below were employed and IC1000 (Rodel Co., Ltd.) was employed as a polishing pad. Incidentally, FIG. 3 also shows a water supply nozzle 24 and a dresser 26.

The slurry used in the polishing of the Cu film was prepared as follows. First of all, each of components was mixed with deionized water according to the following recipe to obtain a stock liquid of slurry. Incidentally, the content of each component indicates a ratio based on a total quantity of slurry.

Oxidizing agent: ammonium persulfate=1.5 wt %.

Protective film-forming agent:

Water insoluble (a first) complexing agent: quinaldinic acid=0.2 wt %; quinolinic acid=0.3 wt %; potassium dodecylbenzene sulfonate=0.05 wt %.

Water soluble (a second) complexing agent: glycine=0.3 wt %; ammonia dissociated from ammonium persulfate.

Colloidal silica: 0.4 wt % of colloidal silica having an association degree of 2 and a primary particle diameter of 20 nm; and 0.1 wt % of colloidal silica having an association degree of 2 and a primary particle diameter of 38 nm.

Further, by using potassium hydroxide, the slurry was adjusted to have a pH of 9.

As a water-soluble polymer compound, there were prepared acetylene diole-based nonion (ACD), polyvinylpyrrolidone (PVP), polyvinyl alcohol (PVA), cellulose (HEC), polyethyl imine (PEI), polyalkyl ether (PAE) and potassium polyacrylate (PAK) as a polyacrylate. The molecular weight of these water-soluble polymer compounds was all set to 45,000.

The slurry of No. 1 was prepared using only the aforementioned stock solution of slurry without incorporating a water-soluble polymer compound. The slurries of Nos. 2-15 were prepared using the water-soluble polymer compounds with the recipe shown in the following Table 1.

TABLE 1

| | Additives | |
|---|---|---|
| No. | Kinds | Content (wt %) |
| 1 | None | None |
| 2 | ACD | 0.1 |
| 3 | | 0.3 |
| 4 | PVP | 0.1 |
| 5 | | 0.3 |
| 6 | PVA | 0.1 |
| 7 | | 0.3 |
| 8 | HEC | 0.1 |
| 9 | | 0.3 |
| 10 | PEI | 0.1 |
| 11 | | 0.3 |
| 12 | PAE | 0.1 |
| 13 | | 0.3 |
| 14 | PAK | 0.1 |
| 15 | | 0.3 |

By using 15 kinds of slurries shown in Table 1, the CMP of the Cu film 17 was performed under the conditions described above, thereby investigating the polishing rate of Cu, the stop of CMP, the electric current of table motor and the dishing of Cu.

The polishing rate of Cu was calculated by measuring the sheet resistance of Cu solid film after polishing the Cu solid film having a thickness of 2000 nm for 60 seconds. A sample exhibiting a Cu-polishing rate of 800 nm/min or more was marked by a symbol of "○" and a sample exhibiting a Cu-polishing rate of less than 800 nm/min was marked by a symbol of "X".

The stop of CMP was determined by continuously polishing 25 sheets of Cu solid film having a thickness of 2000 nm. A sample which was capable of accomplishing the polishing of 25 sheets of Cu solid film was marked by a symbol of "○" and a sample which was stopped polishing during this continuous polishing was marked by a symbol of "X".

The electric current of table motor during the polishing reflects the polishing load, so that the smaller the value of electric current of table motor is, the lower the polishing load with which the polishing can be performed. Further, even if the polishing is performed at a low polishing load, when the polishing friction is large, the electric current of table motor would be increased. If the electric current of table motor exceeds 8A, the peeling of film tends to increase sharply. In this embodiment, a maximum value which was obtained on the occasion of performing the CMP of Cu solid film having a thickness of 2000 nm under the aforementioned conditions was assumed as being the electric current of table motor. A sample where the electric current of table motor was not higher than 8A was marked by a symbol of "◯" and a sample where the electric current of table motor was higher than 8A was marked by a symbol of "X".

In the determination of the dishing of Cu, an over-polishing of 50%, based on the time period of CMP required for enabling the barrier metal to expose after the removal of Cu, was performed and the height of resultant step portion was determined by AFM. A sample where the magnitude of dishing was not larger than 20 nm was marked by a symbol of "◯" and a sample where the magnitude of dishing was larger than 20 nm was marked by a symbol of "X".

The results obtained through the employment of each of slurries are summarized in Table 2 shown below.

TABLE 2

| No. | Cu-polishing rate (nm/min) | CMP stop | Electric current of table motor (A) | Dishing of Cu (nm) |
| --- | --- | --- | --- | --- |
| 1 | ◯ | X | X | X |
| 2 | ◯ | X | X | ◯ |
| 3 | ◯ | X | X | X |
| 4 | ◯ | ◯ | ◯ | ◯ |
| 5 | ◯ | ◯ | ◯ | ◯ |
| 6 | X | ◯ | ◯ | ◯ |
| 7 | X | ◯ | ◯ | ◯ |
| 8 | ◯ | ◯ | ◯ | X |
| 9 | ◯ | ◯ | ◯ | X |
| 10 | ◯ | ◯ | ◯ | X |
| 11 | ◯ | ◯ | ◯ | X |
| 12 | ◯ | ◯ | X | ◯ |
| 13 | ◯ | ◯ | X | ◯ |
| 14 | ◯ | ◯ | ◯ | X |
| 15 | ◯ | ◯ | ◯ | X |

Since the slurry of No. 1 contained no water-soluble polymer compound, the slurry was no good (NG) in three respects, i.e., CMP stop, the electric current of table motor and the dishing of Cu. It will be recognized from this result that the incorporation of a water-soluble polymer compound in the slurry is necessary in order to improve these features. The ACD employed in the slurries of Nos. 2 and 3 was a water-soluble polymer compound that had been employed in the conventional slurry. When such a conventional slurry was employed, NG was recognized in CMP stop and the electric current of table motor. With respect to the dishing of Cu, it was found dependent on the content of ACD, so that in a sample where the content of ACD was 0.1 wt %, the result was found OK but in a sample where the content of ACD was 0.3 wt %, the result was found NG. In the cases of samples of Nos. 4 and 5 where PVP was incorporated, every items were found OK and not dependent on the content of the water-soluble polymer compound as far as this system is concerned. Whereas, in the cases of samples Nos. 6-15 where other kinds of water-soluble polymer compounds were incorporated therein, there was no sample which was capable of satisfying all of the items including the polishing rate of Cu, CMP stop, the electric current of table motor and the dishing of Cu. It had been confirmed from the above-mentioned results that PVP was very excellent in properties as a water-soluble polymer compound.

Then, the sample of No. 2 was compared with the sample of No. 4, wherein the items of comparison included the Cu-polishing action at the over-plating portion which was caused to create in the Cu plating, the in-plane uniformity of Cu-polishing rate, the polishing rate of barrier metal, and the polishing rate of the insulating film. The over-plating was caused to generate at the fine wiring region of large scale. Specifically, the over-plating was caused to generate at a region where the width of wiring was 60 nm, the coverage ratio was 50% and the area thereof was 2 $mm^2$. The magnitude of the step portion generated in this region after the polishing of Cu film was measured by AFM to evaluate the Cu-polishing action. The in-plane uniformity of Cu-polishing rate was determined in such a manner that the sheet resistance of 59 points spaced away from each other at intervals of 5 mm in radial direction of a wafer having a diameter of 300 mm was measured and evaluated by 3σ. As for the barrier metal, Ta and Ti were employed. As for the insulating film, the investigation thereof was made based on $SiO_2$. The results thus obtained are summarized in Table 3 shown below.

TABLE 3

| No. | Step portion (nm) | In-plane uniformity (%) | Polishing rate (nm/min) | | |
| --- | --- | --- | --- | --- | --- |
| | | | Ta | Ti | $SiO_2$ |
| 2 | 10~22 | 11.2% | 4.9 | 13 | 2.2 |
| 4 | 0 | 7.8% | 1 | 4 | 2 |

As for the Cu-polishing action of the over-plating portion, it can be explained as follows. When Cu plating was performed at the fine wiring region where the width of wiring was 0.1 μm or less, the Cu film was formed convexly relative to the field region. In this embodiment, the height of the convexty at the over-plating portion was about 250 nm. When the step portion formed after the CMP using the slurry of No. 2 was measured by AFM, a thin film of Cu having a thickness of 10-22 nm was found left remained. Due to this residual Cu thin film, the damascene wiring was connected with each other at an upper portion thereof through Cu. This residual thin film is required to be removed in the second polishing (touch-up CMP) of the next step. However, since the depth of wiring is shallow, the magnitude of abrasion in the second polishing is required to be as small as possible in order to make uniform the depth of wirings differing in width. Therefore, in the case where the conventional slurry was employed, it is impossible to completely remove the residual thin film of Cu even in the second polishing. Even if it is possible to remove the residual thin film of Cu, it is very difficult to control both of the fine wiring having a width of 60 nm and the wide wiring having a width of 75 μm so as to make them have a desired depth. For this reason, the recessed/projected portions of Cu film on a semiconductor substrate are required to be as minimal as possible at the moment when the first polishing was finished. In the case where the slurry of No. 4 was employed however, the step portion (thickness of residual Cu film) after finishing the CMP was 0 nm, making it ideal in finishing.

With respect to the in-plane uniformity of Cu-polishing rate, the slurry of No. 4 was also excellent. Because of this reason, the finishing of wiring can be made uniform and hence the time period of over-polishing can be shortened. Since excessive over-polishing leads to the generation of Cu corrosion, it is possible to obviate such a problem by using the slurry of No. 4.

In the first polishing, the polishing rate of the barrier metal and the insulating film should desirably be as small as possible. Because, when the ratio (selectivity ratio) between the polishing rate of the barrier metal and the insulating film and the polishing rate of Cu is increased, the dishing of Cu can be suppressed. The slurry of No. 4 is effective in reducing the polishing rate of the barrier metal (Ta, Ti) and the insulating film ($SiO_2$). Therefore, it is possible, through the employment of this slurry, to achieve an ideal first polishing.

Further, as long as PVP is incorporated in the slurry, the water-soluble polymer compounds employed in the samples of Nos. 2, 3, 6-15 may be additionally incorporated in the slurry. For example, in order to further decrease the polishing friction, PVA, PAK or ACD may be additionally incorporated in the slurry. Further, in order to further enhance the erosion resistance of Cu, ACD or PVA may be additionally incorporated in the slurry. In either cases, there is no possibility of deteriorating the aforementioned effects of PVP.

Embodiment 2

By using the stock solution of slurry prepared in the aforementioned Embodiment 1 and by mixing PVPs differing in weight average molecular weight at mixing ratios shown in the following Table 4, the slurries of Nos. 16-50 were prepared.

TABLE 4

| No. | Molecular weight | Content (wt %) |
|---|---|---|
| 16 | 10,000 | 0.01 |
| 17 |  | 0.03 |
| 18 |  | 0.05 |
| 19 |  | 0.1 |
| 20 |  | 0.3 |
| 21 |  | 0.5 |
| 22 |  | 0.7 |
| 23 | 20,000 | 0.01 |
| 24 |  | 0.03 |
| 25 |  | 0.05 |
| 26 |  | 0.1 |
| 27 |  | 0.3 |
| 28 |  | 0.5 |
| 29 |  | 0.7 |
| 30 | 40,000 | 0.01 |
| 31 |  | 0.03 |
| 32 |  | 0.05 |
| 33 |  | 0.1 |
| 34 |  | 0.3 |
| 35 |  | 0.5 |
| 36 |  | 0.7 |
| 37 | 100,000 | 0.01 |
| 38 |  | 0.03 |
| 39 |  | 0.05 |
| 40 |  | 0.1 |
| 41 |  | 0.3 |
| 42 |  | 0.5 |
| 43 |  | 0.7 |
| 44 | 200,000 | 0.01 |
| 45 |  | 0.03 |
| 46 |  | 0.05 |
| 47 |  | 0.1 |
| 48 |  | 0.3 |
| 49 |  | 0.5 |
| 50 |  | 0.7 |

By using each of slurries, the polishing of the Cu film was performed under the same conditions described in Embodiment 1, thereby investigating the polishing rate of Cu, the stop of CMP, the electric current of table motor, the dishing of Cu, and the corrosion of Cu.

The corrosion of Cu was evaluated such that a sample having not more than 10 portions of Cu corrosion per 1 $cm^2$ was marked by a symbol of "○" and a sample having more than 10 portions of Cu corrosion per 1 $cm^2$ was marked by a symbol of "X". As for the other items, they were evaluated in the same manner as described in Embodiment 1. The results obtained are summarized in the following Table 5, wherein the viscosity of each of the slurries as measured by Brookfield viscometer is also shown.

TABLE 5

| No. | Polishing rate (nm/min) | CMP stop | Electric current of table motor (A) | Dishing (nm) | Corrosion (number) | Viscosity (mPa · sec) |
|---|---|---|---|---|---|---|
| 16 | ○ | ○ | X | X | X | 1.1 |
| 17 | ○ | ○ | X | X | X | 1.1 |
| 18 | ○ | ○ | X | X | X | 1.2 |
| 19 | ○ | ○ | X | X | X | 1.3 |
| 20 | ○ | ○ | X | X | X | 1.5 |
| 21 | ○ | ○ | ○ | X | X | 1.6 |
| 22 | ○ | ○ | ○ | X | X | 1.8 |
| 23 | ○ | ○ | X | X | X | 1.1 |
| 24 | ○ | ○ | ○ | ○ | ○ | 1.1 |
| 25 | ○ | ○ | ○ | ○ | ○ | 1.2 |
| 26 | ○ | ○ | ○ | ○ | ○ | 1.3 |
| 27 | ○ | ○ | ○ | ○ | ○ | 1.5 |
| 28 | ○ | ○ | ○ | ○ | X | 1.6 |
| 29 | ○ | ○ | ○ | ○ | X | 1.8 |
| 30 | ○ | ○ | ○ | ○ | ○ | 1.1 |
| 31 | ○ | ○ | ○ | ○ | ○ | 1.2 |
| 32 | ○ | ○ | ○ | ○ | ○ | 1.3 |
| 33 | ○ | ○ | ○ | ○ | ○ | 1.3 |
| 34 | ○ | ○ | ○ | ○ | ○ | 1.6 |
| 35 | ○ | ○ | ○ | ○ | X | 1.8 |
| 36 | ○ | ○ | ○ | ○ | X | 1.9 |
| 37 | ○ | ○ | ○ | ○ | ○ | 1.2 |
| 38 | ○ | ○ | ○ | ○ | ○ | 1.2 |
| 39 | ○ | ○ | ○ | ○ | ○ | 1.3 |
| 40 | ○ | ○ | ○ | ○ | ○ | 1.4 |
| 41 | ○ | ○ | ○ | ○ | ○ | 1.7 |
| 42 | X | ○ | ○ | ○ | ○ | 2.0 |
| 43 | X | ○ | ○ | X | X | 2.2 |
| 44 | ○ | ○ | ○ | ○ | ○ | 1.2 |
| 45 | ○ | ○ | ○ | ○ | ○ | 1.3 |
| 46 | ○ | ○ | ○ | ○ | ○ | 1.3 |
| 47 | ○ | ○ | ○ | ○ | ○ | 1.5 |
| 48 | ○ | ○ | ○ | ○ | ○ | 1.9 |
| 49 | X | ○ | ○ | X | X | 2.2 |
| 50 | X | ○ | ○ | X | X | 2.4 |

This table indicates that there are preferable ranges with respect to the weight average molecular weight and the content of the PVP. In order to satisfy all of the polishing rate of Cu, the stop of CMP, the electric current of table motor, the dishing of Cu, and the corrosion of Cu, the weight average molecular weight of the PVP should be confined to 20,000 or more. If the weight average molecular weight of PVP is less than 20,000, it would be impossible to suitably control the electric current of table motor, the dishing of Cu, and the corrosion of Cu. On the other hand, with respect to the upper limit of the weight average molecular weight of the PVP, it has been confirmed that as long as the viscosity of slurry is confined to less than 2 mPa·sec, excellent results can be obtained if the weight average molecular weight of PVP is confined to not more than 200,000.

If the viscosity of slurry is confined to less than 2 mPa·sec, the viscosity of slurry is almost identical with that of water, so that the viscosity of slurry can be considered as being approximately constant without depending on the shearing velocity of slurry. A slurry of low viscosity can be fed to the polishing pad in a stable manner, thus obviating any possibilities of generating defects on the surfaces of metallic film or of insulating film. As a result, the metallic film can be stably and uniformly polished with low friction. In the case of the slurry exhibiting a viscosity of as high as 2 mPa·sec or more, these effects cannot be obtained. Since the surface of metallic film would become more excellent as the viscosity of slurry is lowered, the viscosity of slurry should preferably be 1.5 mPa·sec or less. Incidentally, although there is not any particular limitation with respect to the lower limit in viscosity of slurry, since deionized water is employed as a dispersion medium, the viscosity of slurry would become 1 mPa·sec or more in general.

On the other hand, the optimum range in content of the PVP would differ slightly depending on the weight average molecular weight thereof. For example, when the weight average molecular weight of the PVP is 20,000, the optimum range in content of the PVP may range from 0.05 to 0.3 wt %. When the weight average molecular weight of the PVP is 40,000, the optimum range in content of the PVP may range from 0.01 to 0.3 wt %. Further, even when the weight average molecular weight of the PVP is 100,000 or 200,000, the optimum range in content of the PVP may range from 0.01 to 0.3 wt %. Namely, the optimum range in content of the PVP tends to decrease as the weight average molecular weight of slurry becomes larger.

When the PVP having a weight average molecular weight of 40,000 or more is incorporated in slurry at an amount ranging from 0.01 to 0.1 wt % based on a total quantity of the slurry, it would be possible to satisfy all of properties desired of the slurry. Moreover, the viscosity of slurry can be confined within a preferable range of 1.5 mPa·sec or less. More specifically, it is possible, in this case, to achieve low friction, high polishing rate and low barrier metal-polishing rate in the first polishing. Additionally, the dishing of Cu and the erosion of insulating film can be suppressed, thus making it possible to minimize the defects such as the corrosion and scratch of Cu. Furthermore, the Cu polishing action at an over-plating portion of Cu can be enhanced, thus making it possible to enhance the stability of polishing and the uniformity of polishing rate. In the second polishing also, it is possible to achieve the low friction and to suppress the dishing of Cu and the erosion of insulating film. With respect to the polishing rate of barrier metal also, the aforementioned ranges of the PVP are practical so that there would be raised no problem. Additionally, the defects such as the corrosion and scratch of Cu can be minimized, thus making it possible to enhance the stability of polishing and the uniformity of polishing rate.

As long as the conditions that the slurry includes at least one kind of PVP having a weight average molecular weight of 20,000 or more at an amount ranging from 0.01 to 0.3 wt % based on a total quantity of the slurry are fulfilled, two or more kinds of PVP differing in weight average molecular weight from each other may be incorporated in the slurry. In this case also, it is possible to obtain almost the same effects as described above. If it is difficult to keep a low viscosity of slurry due to the influences of pH of slurry or of an additive of strong electrolyte, it can be adjusted by incorporating a PVP of low molecular weight of about 10,000 to the slurry.

For the purpose of comparison, a slurry was prepared as follows and used to polish a Cu film under the same conditions as described above, thereby investigating the properties of the slurry. More specifically, a slurry of No. 51 was prepared according to the same formulation as that of the slurry of No. 33 except that colloidal silica was not incorporated in the slurry. Further, three kinds of slurries were prepared according to the same formulation as that of the slurry of No. 33 except that 0.5 wt % of colloidal silica differing in size of primary particle was employed. More specifically, by using colloidal silica having a primary particle diameter of 3 nm, the slurry of No. 52 was prepared, by using colloidal silica having a primary particle diameter of 60 nm, the slurry of No. 53 was prepared, and by using colloidal silica having a primary particle diameter of 100 nm, the slurry of No. 54 was prepared.

In the case of the slurry (No. 51) containing no colloidal silica, the polishing action became non-uniform, thus making it impossible to uniformly abrade a pattern of various widths. In the case of the slurry (No. 52) also where the primary particle diameter of colloidal silica is small, almost the same results as those of sample No. 51 were obtained. In the case of the slurry (No. 53) where the primary particle diameter thereof was 60 nm, the dishing and scratch became prominent, exceeding practical ranges thereof. If the primary particle diameter of colloidal silica was further increased (No. 54), it was difficult to reduce the Ra of polishing surface to 3 nm or less and, at the same time, the magnitudes of dishing and scratch were also greatly increased over acceptable ranges.

In the aforementioned Embodiments 1 and 2, the conditions required in Cu-CMP were assumed as follows, and attentions were paid to slurries which were capable of satisfying such conditions. Namely, the slurries are required such that the polishing rate of Cu is not lower than 800 nm/min, CMP would not stop during polishing, the electric current of table motor during polishing is 8 A or less, and the dishing of Cu can be suppressed to 20 nm or less.

The conditions required in Cu-CMP would not be limited to those described above. Namely, depending on the conditions desired, the composition of slurry can be determined. For example, even if the polishing rate of Cu is less than 800 nm/min, if the dishing of Cu is required to be further minimized to not more than 10 nm, a total content of colloidal silica may be reduced from 0.5 to 0.1 wt %. Alternatively, it is also effective, in this case, to adopt a method of reducing the primary particle diameter of colloidal silica to about 5-10 nm. For example, two kinds of colloidal silica, i.e., 0.4 wt % of colloidal silica 1.5 in association degree and 5 nm in primary particle diameter and 0.1 wt % of colloidal silica 1.5 in association degree and 25 nm in primary particle diameter, can be combined with each other for use. Alternatively, the polishing load may be decreased. In either cases, even if the polishing rate of Cu may be decreased to about 550 nm/min, since the polishing surface would not be affected by the mechanical effect of more than required, they are suited for forming a Cu damascene wiring of as shallow as 100 nm or less.

On the other hand, if it is required to enhance the polishing rate of Cu even if the dishing of Cu may exceed 20 nm, it may be effective to employ a method of changing the content of the protective film-forming agent. In the case of the conventional slurry containing not PVP, 0.5 wt % of quinolinic acid and 0.05 wt % of potassium dodecylbenzene sulfonate are included as a water-insoluble complexing agent and 0.3 wt % of alanine is included as a water-soluble complexing agent for example. Further, the ammonium persulfate incorporated as an oxidizing agent generates ammonia in an alkaline region where pH exceeds 8, thereby enabling it to act as a water-soluble complexing agent. In the case of the conventional slurry having such a composition, the dishing of Cu would be increased to 55 nm even though the polishing rate of Cu would become 1200 nm/min. When a PVP having a weight average molecular weight of 40,000 is incorporated into this conventional slurry at an amount of 0.1 wt %, the dishing of Cu can be suppressed to 30 nm. Moreover, the polishing rate of Cu can be enhanced to 1300 nm/min.

As described above, by using the slurries containing PVP according to embodiments of the present invention, it becomes possible to fulfill the standards of latest semiconductor device. Further, even in the cases of slurries to be used for manufacturing the semiconductor devices of the present or prior generation, the properties of these slurries can be improved by incorporating PVP therein.

Embodiment 3

Figure 4:
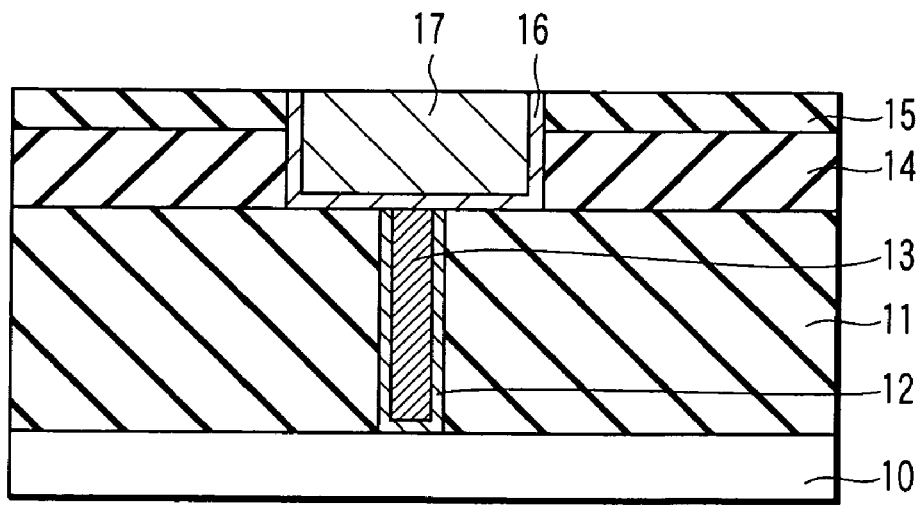
FIG. 4 is a cross-sectional view illustrating the next step following the step shown in FIG. 2.

Next, this embodiment will be explained with reference to FIGS. 2 and 4.

First of all, by using the same materials as employed in the aforementioned Embodiment 1, insulating film, etc., each having the same thickness as that of Embodiment 1, were deposited to obtain a structure as shown in FIG. 1. Thereafter, a first polishing was performed using the slurry of No. 33 under the conditions specified in Embodiment 2 to expose the surface of the barrier metal 16 as shown in FIG. 2. Further, a second polishing (touch-up CMP) was performed to expose the surface of the second low dielectric constant insulating film 15 as shown in FIG. 4.

The touch-up CMP was performed as follows. Namely, first of all, as shown FIG. 3, while rotating a turntable 20 having a polishing pad 21 attached thereto at a speed of 100 rpm, a top ring 23 holding a semiconductor substrate 22 was allowed to contact with the turntable 20 at a polishing load of 200 gf/cm². The rotational speed of the top ring 23 was set to 105 rpm, and slurry 27 was fed onto the polishing pad 21 from a slurry supply nozzle 25 at a flow rate of 200 cc/min. The polishing was performed for 90 seconds using various kinds of slurries as explained below and IC1000 (Rodel Co., Ltd.) as a polishing pad.

The slurry used in the touch-up polishing was prepared as follows. First of all, each of components was mixed with deionized water according to the following recipe to obtain a stock solution of slurry. Incidentally, the content of each component indicates a ratio based on a total quantity of slurry.

Oxidizing agent: hydrogen peroxide=0.1 wt %.

Protective film-forming agent: quinolinic acid=0.3 wt %; maleic acid=0.3 wt %.

Colloidal silica: 3.5 wt % of colloidal silica having an association degree of 2 and a primary particle diameter of 30 nm.

Further, by using potassium hydroxide, the slurry was adjusted to have a pH of 10.5.

As a water-soluble polymer compound, there were prepared PVP (40,000 in weight average molecular weight) and nonionic silicone resin having an HLB value of 13. The HLB value was calculated from an eluted volume of surfactant using GPC. The slurry of No. 55 was prepared using only the aforementioned stock solution of slurry without incorporating a water-soluble polymer compound. The slurries of Nos. 56-71 were prepared according to the recipe shown in the following Table 6.

TABLE 6

| No. | Additives | Content (wt %) |
|---|---|---|
| 55 | — | None |
| 56 | PVP | 0.005 |
| 57 | 40,000 | 0.01 |
| 58 |  | 0.03 |
| 59 |  | 0.05 |
| 60 |  | 0.1 |
| 61 |  | 0.3 |
| 62 |  | 0.5 |
| 63 |  | 0.7 |
| 64 | Silicone | 0.005 |
| 65 |  | 0.01 |
| 66 |  | 0.03 |
| 67 |  | 0.05 |
| 68 |  | 0.1 |
| 69 |  | 0.3 |
| 70 |  | 0.5 |
| 71 |  | 0.7 |

The content of the PVP in this embodiment was confined to the range of 0.005 to 0.7 wt % based on a total quantity of the slurry as shown in Table 6. This range of the content corresponds to the range of 1.43 to 20 wt % of the weight of colloidal silica. As long as the content of the PVP is confined within the range of 0.01 to 0.3 wt % based on a total quantity of the slurry, the ratio of the PVP to the weight of colloidal silica may be suitably changed.

By using 17 kinds of slurries shown in Table 6, the touch-up CMP was performed under the conditions described above, thereby investigating the electric current of table motor, the dishing of Cu, the erosion of insulating film, the defects of Cu and the defect of the insulating film.

The erosion of the insulating film was judged such that when the magnitude of erosion was not more than 20 nm, the sample was marked by a symbol of "◯" and when the magnitude of erosion was larger than 20 nm, the sample was marked by a symbol of "X". The defects of Cu were determined by observing a region of 1 cm×1 cm using an apparatus (KLA-Tenchol Co., Ltd.) wherein the sample exhibiting not more than 10 portions in a total of the corrosion and scratch of Cu was marked by a symbol of "0" and the sample exhibiting more than 10 portions in a total of the corrosion and scratch of Cu was marked by a symbol of "X". The defects of insulating film were determined by observing a region of 1 cm×1 cm using an apparatus (KLA-Tenchol Co., Ltd.) wherein the sample exhibiting not more than 10 portions in a total of the deposit and scratch thereon was marked by a symbol of "◯" and the sample exhibiting more than 10 portions in a total of the deposit and scratch thereon was marked by a symbol of "X". Incidentally, the expression of "the deposit on the insulating film" means the deposit of shavings, etc. on the insulating film. As for the electric current of table motor and the dishing of Cu, they were evaluated in the same manner as described above.

The results obtained using each of these slurries are summarized in the following Table 7.

TABLE 7

| No. | Electric current of table motor (A) | Dishing (nm) | Erosion (nm) | Defects of Cu (number) | Defects of insulating film (number) |
|---|---|---|---|---|---|
| 55 | X | ◯ | X | X | X |
| 56 | X | ◯ | X | ◯ | ◯ |
| 57 | ◯ | ◯ | ◯ | ◯ | ◯ |
| 58 | ◯ | ◯ | ◯ | ◯ | ◯ |
| 59 | ◯ | ◯ | ◯ | ◯ | ◯ |
| 60 | ◯ | ◯ | ◯ | ◯ | ◯ |
| 61 | ◯ | ◯ | ◯ | ◯ | ◯ |
| 62 | ◯ | X | ◯ | X | ◯ |
| 63 | ◯ | X | X | X | ◯ |
| 64 | X | ◯ | X | ◯ | ◯ |
| 65 | X | ◯ | X | ◯ | ◯ |
| 66 | X | ◯ | X | ◯ | ◯ |
| 67 | X | ◯ | ◯ | ◯ | ◯ |
| 68 | X | ◯ | ◯ | X | X |

TABLE 7-continued

| No. | Electric current of table motor (A) | Dishing (nm) | Erosion (nm) | Defects of Cu (number) | Defects of insulating film (number) |
|---|---|---|---|---|---|
| 69 | X | ○ | ○ | X | X |
| 70 | X | X | ○ | X | X |
| 71 | X | X | X | X | X |

In the touch-up CMP, it was also possible to confirm the effects of slurries of the embodiment of present invention. In the case of the slurry of No. 55, it was only possible to suppress the dishing of Cu to not more than 20 nm, but, with respect to other items, the slurry of No. 55 failed to satisfy the requirements of them. Since the SiOC constituting the second low dielectric constant insulating film 15 in this embodiment was a hydrophobic film, it was assumed difficult to stably perform the CMP under a liquid-lubricated condition. In the cases of samples of Nos. 64-71 where silicone resin was incorporated therein, the electric current of table motor was increased, thus narrowing the range where the erosion of insulating film could be suppressed. The reason for this can be attributed to the easiness of aggregating colloidal silica due to the presence of silicone resin.

On the other hand, in the cases of samples where PVP was incorporated (i.e., slurries of Nos. 57-61), every items were found OK as long as the content thereof was confined within the range of 0.01 to 0.3 wt %. Especially, with respect to the effect of reducing the polishing rate of SiOC and the phenomenon of increasing the erosion between Cu and SiOC, prominent improvement was recognized. In the case of the sample No. 56 where the content of PVP was not more than 0.005 wt %, since the content of PVP was too small, it was impossible to sufficiently derive the effect of improving the electric current of table motor and the erosion. On the other hand, in the case of the samples Nos. 62 and 63 where the content of PVP was 0.5 wt % or more, the dishing and defects of Cu were increased and the erosion was also increased. When the viscosity of slurry is taken into consideration together with the polishing property, the content of PVP having a weight average molecular weight of 40,000 should preferably be confined to the range of 0.01 to 0.1 wt % based on a total quantity of the slurry.

In the touch-up CMP of this embodiment, although SiOC was employed as the second low dielectric constant insulating film to be exposed in this CMP, it is possible to employ another structure. Namely, almost the same effects can be expected in the structure where $SiO_2$ is abraded or $SiO_2$ in an $SiO_2$/SiOC laminate is abraded and the abrasion thereof is stopped with SiOC. It has been confirmed that when PVP having a weight average molecular weight of 20,000 is incorporated in the slurry, the polishing rate of $SiO_2$ can be reduced into the range of ⅓ to ⅔ and the polishing rate of SiOC can be reduced to 1/10 or less as compared with a slurry containing no PVP. Depending on the polishing rate required of the insulating film, the content of PVP can be adjusted within a practical range.

If the touch-up CMP is to be performed while controlling the polishing rate of Cu, a barrier metal and an insulating film, it may be also effective to shift the pH of slurry to the acidic region. Further, it is also effective to employ 7-hydroxy-5-methyl-1,3,4-triazaindolizine as a water-insoluble (a first) complexing agent, and to employ, as a water-soluble (a second) complexing agent, at least one selected from the group consisting of phthalic acid, oxalic acid, citric acid, lactic acid, acetic acid, TMAH and ethylene diamine.

For the purpose of comparison, a slurry was prepared as follows and used to perform the touch-up CMP under the same conditions as described above, thereby investigating the properties of the slurry. More specifically, a slurry of No. 72 was prepared according to the same formulation as that of the slurry of No. 59 except that colloidal silica was not incorporated in the slurry. Further, three kinds of slurries were prepared according to the same formulation as that of the slurry of No. 59 except that 3.5 wt % of colloidal silica differing in size of primary particle was employed. More specifically, by using colloidal silica having a primary particle diameter of 3 nm, the slurry of No. 73 was prepared, by using colloidal silica having a primary particle diameter of 60 nm, the slurry of No. 74 was prepared, and by using colloidal silica having a primary particle diameter of 100 nm, the slurry of No. 75 was prepared.

In the case of the slurry (No. 72) containing no colloidal silica, the polishing action became non-uniform, thus making it impossible to uniformly abrade a pattern of various widths. In the case of the slurry (No. 73) also where the primary particle diameter of colloidal silica is small, almost the same results as those of sample No. 72 were obtained, resulting in the deterioration of polishing action to the barrier metal and $SiO_2$ in particular. In the case of the slurry (No. 74) where the primary particle diameter thereof was 60 nm, the dishing and scratch became prominent, exceeding practical ranges thereof. If the primary particle diameter of colloidal silica was further increased (No. 75), it was difficult to reduce the Ra of polishing surface to 3 nm or less and, at the same time, the magnitudes of dishing and scratch were also greatly increased over acceptable ranges.

Since the slurries according to the embodiment of the present invention contain PVP having a weight average molecular weight of not less than 20,000 at an amount ranging from 0.01 to 0.3 wt % based on a total weight of slurry, they can be stably fed onto the polishing pad and the polishing of a metallic film can be stably and uniformly performed with low friction. There is no possibility of generating defects in the metallic film or the insulating film. Moreover, it has been confirmed that since the primary particle diameter of the colloidal silica to be incorporated in the slurry is confined to the range of 5 to 50 nm, it is possible, through the employment of the slurry according to the embodiment of the present invention, to stably polish the metallic film and to confine the Ra of polishing surface to 3 nm or less. Unless all of the conditions including the weight average molecular weight and the content of PVP, and the primary particle diameter of colloidal silica are entirely satisfied, it would be impossible to achieve the aforementioned effects.

Embodiment 4

This embodiment will be explained with reference to FIGS. 5 and 6.

Figure 5:
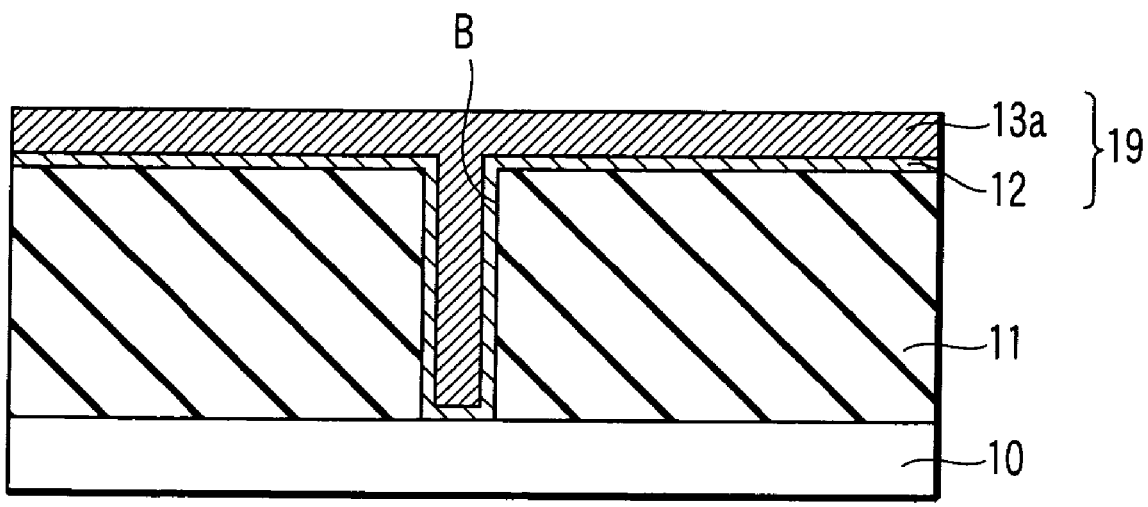
FIG. 5 is a cross-sectional view illustrating one step in the method of manufacturing a semiconductor device according to another embodiment of the present invention.
Figure 6:
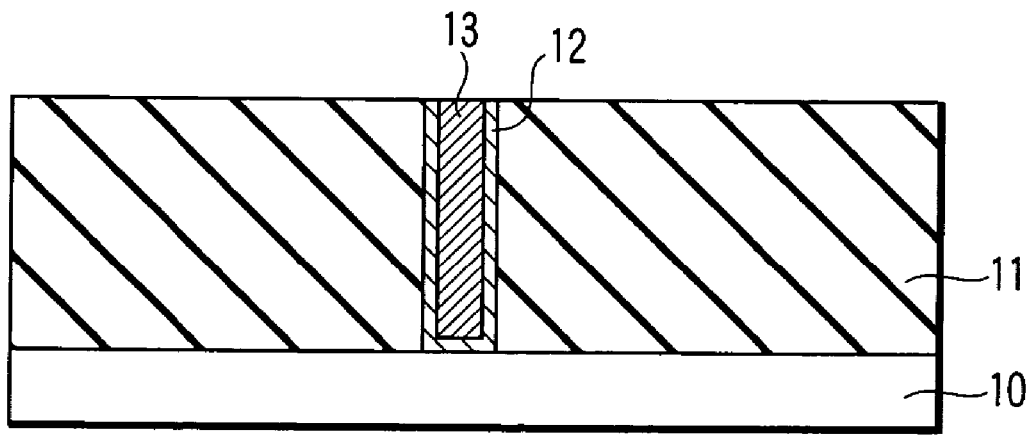
FIG. 6 is a cross-sectional view illustrating the next step following the step shown in FIG. 5.

First of all, as shown in FIG. 5, an insulating film 11 of $SiO_2$ was formed on a semiconductor substrate 10 having a semiconductor element (not shown) formed thereon and a hole B was formed as a recess. The diameter of the hole B was set to 0.1 μm and the coverage ratio thereof was set to 25%. Further, a plug material film 13a was deposited with a barrier film 12 being interposed between the insulating film 11 and the plug material film 13a. The barrier metal 12 was formed using TiN film having a thickness of 15 nm and the plug material film 13a was formed by depositing a W film having a thickness of 150 nm. Subsequently, a metallic film 19 comprising the plug material film 13a and the barrier metal 12 was selectively removed by CMP, thereby burying a plug 13 in the hole B with the barrier metal 12 being interposed therebetween as shown in FIG. 6.

The CMP of the metallic film 19 was performed as follows. Namely, first of all, as shown FIG. 3, while rotating a turntable 20 having a polishing pad 21 attached thereto at a speed of 70 rpm, a top ring 23 holding a semiconductor substrate 22 was allowed to contact with the turntable 20 at a polishing load of 200 gf/cm2. The rotational speed of the top ring 23 was set to 75 rpm, and slurry 27 was fed onto the polishing pad 21 from a slurry supply nozzle 25 at a flow rate of 200 cc/min. The polishing was performed using various kinds of slurries as explained below and IC1000 (Rodel Co., Ltd.) as a polishing pad. The polishing was performed so as to achieve +50% over-polishing in addition to the time period required for CMP wherein the W film employed as the plug material film 13a was removed and the TiN film employed as the barrier metal 12 was exposed.

The slurry used in the polishing of the metallic film 19 was prepared as follows. First of all, each of components was mixed with deionized water according to the following recipe to obtain a stock solution of slurry. Incidentally, the content of each component indicates a ratio based on a total quantity of slurry.

Oxidizing agent: ferric nitrate=3 wt %.
Protective film-forming agent: benzotriazole=0.025 wt %; malonic acid=0.3 wt %.
Colloidal silica: 2.5 wt % of colloidal silica having an association degree of 2 and a primary particle diameter of 15 nm; and 0.5 wt % of colloidal silica having an association degree of 2 and a primary particle diameter of 50 nm.

Further, the slurry was adjusted to have a pH of 2.2.

The slurry of No. 76 was prepared using only the aforementioned stock solution of slurry, and the slurry of No. 77 was prepared by incorporating 0.05 wt %, based on a total quantity of the slurry, of PVP (weight average molecular weight: 100,000) as a water-soluble polymer into the slurry.

By using these two kinds of slurries, the CMP of the plug material film 13a and the barrier metal 12 was performed under the aforementioned conditions. Then, the measurement of step portion by AFM was performed in a region of 300 μm×300 μm of the array portion where plugs having a diameter of 0.1 μm were disposed at a coverage ratio of 25%. As a result, it was found that in the case of the slurry No. 76 containing no PVP, a step portion having a height of as high as 52 nm was recognized. Whereas, in the case of the slurry No. 77 containing PVP, the height of step portion was 18 nm, indicating a prominent decrease in height of step portion. As long as the height of step portion is confined to not higher than 20 nm, it would not give any substantial adverse influence to the properties of wiring and hence deemed to be acceptable.

Embodiment 5

By following the same procedures as described in aforementioned Embodiment 4 except that the barrier metal 12 was altered to a Nb film having a thickness of 10 nm and the plug material film 13a was altered to an Al film having a thickness of 150 nm, a structure shown in FIG. 5 was formed. Subsequently, a metallic film 19 comprising the plug material film 13a and the barrier metal 12 was selectively removed by CMP, thereby burying a plug 13 in the hole B as shown in FIG. 6.

The CMP of the metallic film 19 was performed as follows. Namely, first of all, as shown FIG. 3, while rotating a turntable 20 having a polishing pad 21 attached thereto at a speed of 115 rpm, a top ring 23 holding a semiconductor substrate 22 was allowed to contact with the turntable 20 at a polishing load of 150 gf/cm2. The rotational speed of the top ring 23 was set to 120 rpm, and slurry 27 was fed onto the polishing pad 21 from a slurry supply nozzle 25 at a flow rate of 300 cc/min. The polishing was performed using various kinds of slurries as explained below and IC1000 (Rodel Co., Ltd.) as a polishing pad. The polishing was performed so as to achieve +50% over-polishing in addition to the time period required for CMP wherein the Al film employed as the plug material film 13a was removed and the Nb film employed as the barrier metal 12 was exposed.

The slurry used in the polishing of the metallic film 19 was prepared as follows. First of all, each of components was mixed with deionized water according to the following recipe to obtain a stock solution of slurry. Incidentally, the content of each component indicates a ratio based on a total quantity of slurry.

Oxidizing agent: ammonium persulfate=1 wt %.
Protective film-forming agent: quinolinic acid=0.75 wt %; potassium dodecylbenzene sulfonate=0.075 wt %; glycine=1 wt %.
Colloidal silica: 5 wt % of colloidal silica having a primary particle diameter of 10 nm (a composite particle which was integrated with an organic particle (PMMA) having a particle diameter of 100 nm at a ratio of 0.5 wt %).

The pH of slurry was about 5.

The slurry of No. 78 was prepared using only the aforementioned stock solution of slurry, and the slurry of No. 79 was prepared by incorporating 0.05 wt %, based on a total quantity of the slurry, of PVP (weight average molecular weight: 90,000) as a water-soluble polymer into the slurry.

By using these two kinds of slurries, the CMP of the plug material film 13a and the barrier metal 12 was performed under the aforementioned conditions. Then, the measurement of step portion by AFM was performed in a region of 300 μm×300 μm of the array portion where plugs having a diameter of 0.1 μm were disposed at a coverage ratio of 25%. As a result, it was found that in the case of the slurry No. 78 containing no PVP, a step portion having a height of as high as 35 nm was recognized. Whereas, in the case of the slurry No. 79 containing PVP, the height of step portion was 20 nm, indicating a prominent decrease in height of step portion. As already explained above, as long as the height of step portion is confined to not higher than 20 nm, it would not give any substantial adverse influence to the properties of wiring and hence deemed to be acceptable.

In the foregoing embodiments, Cu was employed as a wiring material, W and Al were employed as a plug material, and Ta, TiN and Nb were employed as a barrier metal. It should be noted however that the kinds of metals which are capable of exhibiting the effects of slurries according to the embodiments of the present invention would not be limited these metals.

The slurries according to the embodiments of the present invention are also effective to a structure comprising Cu, Al, W, Ti, Ta, V, Mo, Ru, Zr, Mn, Ni, Fe, Ag, Mg, Si, and a laminate containing any of these elements, or even to a structure where a barrier metal is not substantially included. The slurries according to the embodiments of the present invention are expected to exhibit almost the same effects on the occasion of polishing almost any kinds of metals.

According to one aspect of the present invention, it is possible to provide a CMP slurry for metallic film, which is capable of uniformly and stably polishing a metallic film with low friction without raising the problem of defects in the metallic film or in an insulating film. According to another aspect of the present invention, it is possible to provide a method of uniformly and stably polishing a metallic film with low friction without raising the problem of defects in the metallic film or in an insulating film. According to a further aspect of the present invention, it is possible to provide a method of manufacturing a semiconductor device provided with a damascene wiring and exhibiting excellent reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A polishing method comprising:
    contacting a semiconductor substrate having a metallic film with a polishing pad attached to a turntable; and
    supplying a metallic film-CMP slurry having a viscosity of less than 2 mPa·sec onto the polishing pad to polish the metallic film, the metallic film-CMP slurry comprising:
    water;
        0.01 to 0.3 wt %, based on a total quantity of the slurry, of polyvinylpyrrolidone having a weight average molecular weight of not less than 40,000;
        an oxidizing agent;
        a protective film-forming agent containing a first complexing agent for forming a water-insoluble complex and a second complexing agent for forming a water-soluble complex, the first complexing agent containing quinaldinic acid, quinolinic acid, and alkylbenzene sulfonate; and
        colloidal silica having a primary particle diameter ranging from 5 to 50 nm.

2. The method according to claim 1, wherein the metallic film is formed with a wiring metal and the polyvinylpyrrolidone is incorporated in the slurry at a range of 0.03 to 0.3 wt % based on a total quantity of the CMP slurry.

3. The method according to claim 1, wherein the metallic film is formed with a barrier metal and the polyvinylpyrrolidone is incorporated in the slurry at a range of 0.01 to 0.1 wt % based on a total quantity of the CMP slurry.

4. The method according to claim 1, wherein the alkylbenzene sulfonate is selected from a group consisting of potassium dodecylbenzene sulfonate and ammonium dodecylbenzene sulfonate.

5. The method according to claim 1, wherein the metallic film is a Cu film.

6. A method for manufacturing a semiconductor device comprising:
    forming an insulating film above a semiconductor substrate;
    forming a recess in the insulating film;
    depositing a metal inside the recess as well as above the insulating film to form a metallic film; and
    removing at least part of the metal which is deposited above the insulating film by CMP using a metallic film-CMP slurry having a viscosity of less than 2 mPa·sec, the metallic film-CMP slurry comprising:
    water;
        0.01 to 0.3 wt %, based on a total quantity of the slurry, of polyvinylpyrrolidone having a weight average molecular weight of not less than 40,000;
        an oxidizing agent;
        a protective film-forming agent containing a first complexing agent for forming a water-insoluble complex and a second complexing agent for forming a water-soluble complex, the first complexing agent containing quinaldinic acid, quinolinic acid, and alkylbenzene sulfonate; and
        colloidal silica having a primary particle diameter ranging from 5 to 50 nm.

7. The method according to claim 6, wherein the forming the metallic film is performed by forming a barrier metal above the insulating film and forming a wiring metal on the barrier metal.

8. The method according to claim 7, wherein the metal to be removed by the CMP is the wiring metal, and the polyvinylpyrrolidone is incorporated in the slurry at a range of 0.03 to 0.3 wt % based on a total quantity of the CMP slurry.

9. The method according to claim 7, wherein the metal to be removed by the CMP is the barrier metal, and the polyvinylpyrrolidone is incorporated in the slurry at a range of 0.01 to 0.1 wt % based on a total quantity of the CMP slurry.

10. The method according to claim 6, wherein the alkylbenzene sulfonate is selected from a group consisting of potassium dodecylbenzene sulfonate and ammonium dodecylbenzene sulfonate.

11. The method according to claim 6, wherein the metallic film is a Cu film.

* * * * *